United States Patent
Jeng et al.

(10) Patent No.: US 8,434,221 B2
(45) Date of Patent: May 7, 2013

(54) METHOD FOR GENERATING NANO PATTERNS UPON MATERIAL SURFACES

(75) Inventors: Yeau-Ren Jeng, Tainan (TW); Chung-Ming Tan, Chiayi (TW)

(73) Assignee: National Chung Cheng University, Chia-Yi (TW)

( * ) Notice: Subject to any disclaimer, the term of this patent is extended or adjusted under 35 U.S.C. 154(b) by 683 days.

(21) Appl. No.: 12/431,213

(22) Filed: Apr. 28, 2009

(65) Prior Publication Data
US 2009/0272172 A1 Nov. 5, 2009

(30) Foreign Application Priority Data
May 2, 2008 (TW) ............... 97116328 A

(51) Int. Cl.
*H01R 9/00* (2006.01)
*H05K 3/00* (2006.01)

(52) U.S. Cl.
USPC ............. 29/844; 29/846; 29/842; 977/943; 977/947

(58) Field of Classification Search ........... 29/844, 29/830, 825, 842, 846; 174/250, 253, 255, 174/256; 439/55; 977/932, 843, 847
See application file for complete search history.

(56) References Cited

U.S. PATENT DOCUMENTS

| 4,818,728 | A | * | 4/1989 | Rai et al. ................. 438/108 |
| 5,822,285 | A | * | 10/1998 | Rugar et al. ............ 369/44.26 |
| 5,856,967 | A | * | 1/1999 | Mamin et al. ............. 369/126 |
| 5,910,940 | A | * | 6/1999 | Guerra ................... 369/275.1 |
| 7,074,498 | B2 | * | 7/2006 | Tavkhelidze et al. ...... 428/687 |
| 2005/0094298 | A1 | * | 5/2005 | Sakurai et al. ............. 360/15 |

FOREIGN PATENT DOCUMENTS
TW I248859 11/1993

* cited by examiner

Primary Examiner — Peter DungBa Vo
Assistant Examiner — Jeffrey T Carley
(74) Attorney, Agent, or Firm — WPAT, P.C.; Anthony King

(57) ABSTRACT

The present invention discloses a method for generating nano patterns upon material surfaces. The method for generating nano patterns upon material surfaces comprises the following steps: providing a thin film capable of controlling lattice directions, applying a nanoindentation action to the thin film to generate an indentation at a specific position on the thin film. At least one hillock is then generated in a specific direction to generate a pattern and to be applied to a data storage system.

5 Claims, 3 Drawing Sheets

METHOD FOR GENERATING NANO PATTERNS UPON MATERIAL SURFACES

FIELD OF THE INVENTION

The present invention relates to a method for generating nano patterns upon material surfaces, particularly to a method for generating corresponding hillocks by way of a nanoindentation action.

BACKGROUND OF THE INVENTION

Along with the advancement in technology, various micro-machinings and processing techniques progress rapidly, and all kinds of high-tech devices develop with a trend toward precisezation and minimization. These micro-devices have extensive applications in military, industry, medical treatment, electro-optical communication, biotechnology, and daily life, for instance, cell phone, inkjet apparatus of a printer, biological chip, various optical communication devices. Because of human beings' desire for the minimization of materials, the scale used has migrated from micrometer to nanometer. However, the nanometer technology is not only to reduce the size of objects and to make tiny components, but also to study new characteristics and phenomenons while the size of objects is smaller than 100 nanometer, Thin films are applied in an extensive range including different fields, such as sensor, semiconductor, tribology, etc. Due to the rapid development of nanometer technology, the use of nanometer thin films increases day by day. When materials are minimized to nanometer scale, which is between the molecular scale and the macro scale, the characteristics of the nano-sized materials are dramatically different from the characteristics of the block materials which are substantially made of the same substance. Most methods of generating nano patterns are achieved by growing patterns spot by spot, by imprinting directly, such as Taiwan patent No. I248859: a manufacturing method of a nanoimprint imprinter, or by etching. However, there exists a serious limitation to commercializing products by previous methods.

In the assays for nanoindentation in recent years, scientists observe that there exist hillocks along <110> direction as indenting on the (001) Au surface by STM. The phenomenon is confirmed via our atomistic simulations on (001) Au surface during nanoindentation.

With the discovery of the phenomenon, the inventor researches in many ways on the basis of engaging in research for many years and a lot of practical experience. Finally, the method for generating nano patterns upon material surfaces is proposed for implementation.

SUMMARY OF THE INVENTION

In view of the aforementioned problem, the primary objective of the present invention is to provide a method for generating nano patterns upon material surfaces, particularly to a method for generating corresponding hillocks by nanoindentation, which can be applied to a data storage system.

Therefore, to achieve the aforementioned objective, the method for generating nano patterns upon material surfaces according to the present invention comprises the following steps. (a) A thin film capable of controlling lattice directions may be coated on the material surfaces. (b) A nanoindentation action may be applied to the thin film capable of controlling lattice directions, and (c) an indentation may be generated at a specific position of the thin film and thereby at least one hillock may be generated in a specific direction of the thin film.

The present invention discloses a method for generating nano patterns upon material surfaces. The thin film may be a single crystal metal thin film. The heights, and/or the numbers and the patterns of the hillocks may correspond to the intensity of the nanoindentation action. An indentation may be generated by applying the nanoindentation action on the metal thin film capable of controlling the lattice directions such that at least one hillock may be generated in a specific direction of the metal thin film. The hillocks may be used as the content of the stored data.

To make it easier for examiners to understand the technical characteristics and functions of the present invention, preferred embodiments accompanied with related drawings are used for the detailed description of the present invention as follows.

DETAILED DESCRIPTION OF THE PREFERRED EMBODIMENTS

Figure 1:
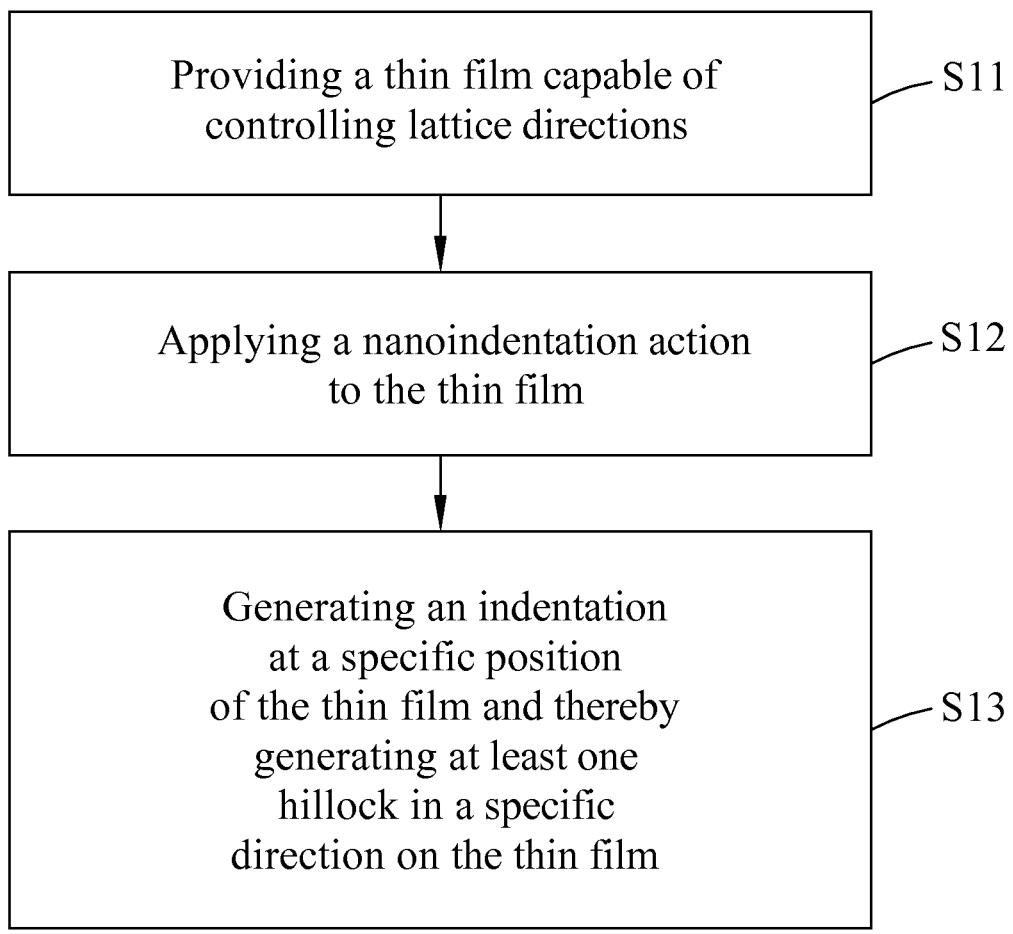
FIG. 1 is a flow chart of a method for generating nano patterns upon material surfaces in accordance with an example of the present invention.

Please refer to FIG. 1 for a flow chart of a method for generating nano patterns upon material surfaces in accordance with an example of the present invention, wherein the method may comprise the steps as follows. In step S11, a thin film capable of controlling lattice directions is coated. In step S12, a nanoindentation action is applied to the thin film capable of controlling lattice directions, and in step S13, an indentation is generated at a specific position, thereby generating at least one hillock in a specific direction of the thin film capable of controlling lattice directions.

The method may further comprise a heating step or other removing steps to vanish the hillocks such that the thin film may be once again applied with the nanoindentation action. The thin film may be a single crystal metal thin film. The heights, and/or the numbers and the patterns of the hillocks correspond to the intensity of the nanoindentation action. Besides, the hillocks can be applied to a data storage method for writing data into a storage device and the storage device thereof.

Figure 2:
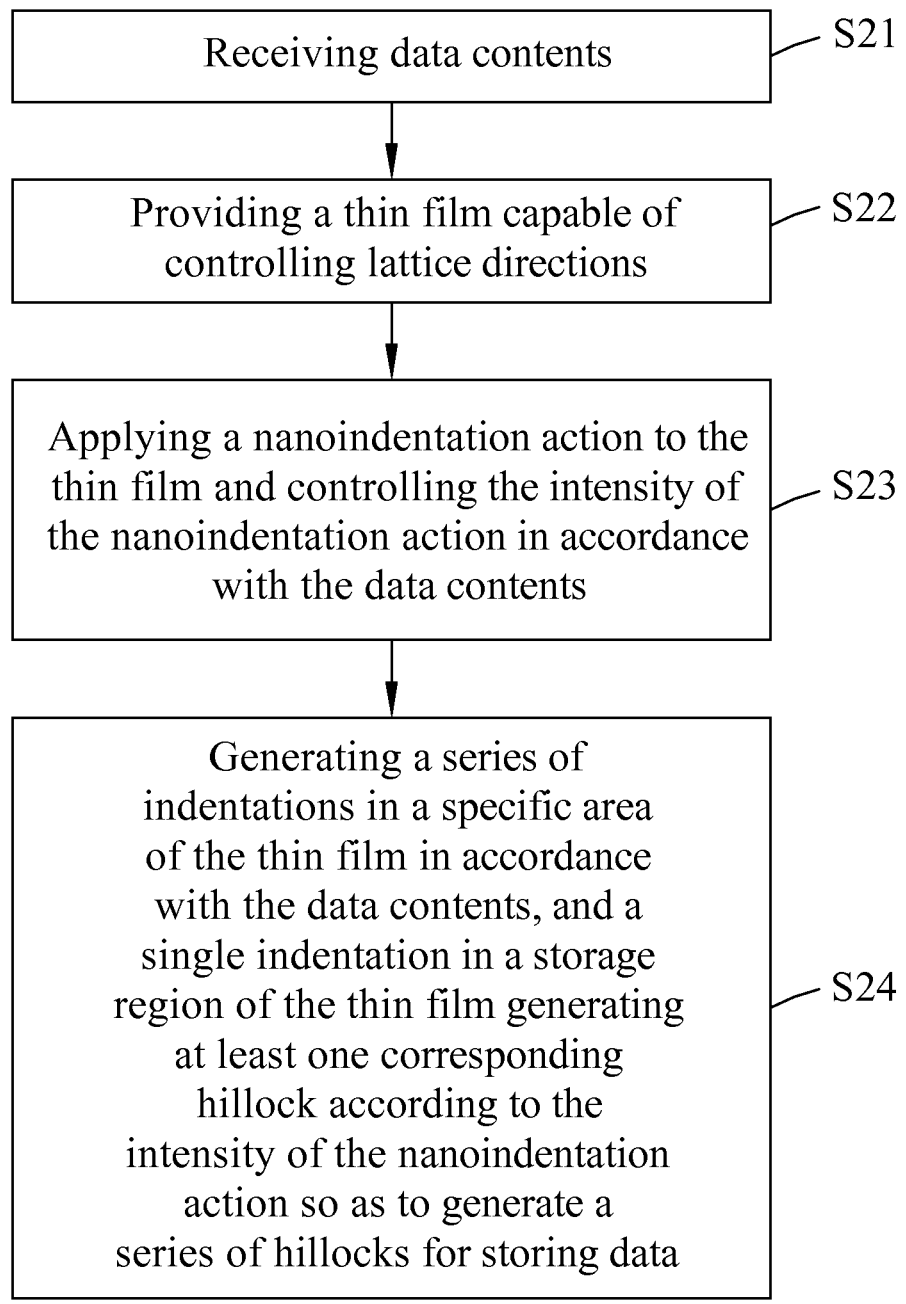
FIG. 2 is a flow chart of a method for storing data in accordance with an example of the present invention.

Please refer to FIG. 2 for a flow chart of a method for storing data in accordance with an example of the present invention, wherein the method comprises the following steps: step S21 in which data contents may be received; step S22 in which a thin film capable of controlling lattice directions may be provided; step S23 in which a nanoindentation action may be applied to the thin film, and the intensity of the nanoindentation action is controlled in accordance with the data contents; and step S24 in which a series of indentations are generated in a specific area of the thin film in accordance with the data contents. Moreover, a single indentation in a storage region of the thin film generates at least one corresponding hillock according to the intensity of the nanoindentation action. Therefore, a series of hillocks is generated for storing data.

The method may further comprise a heating step or other removing steps to vanish the hillocks for deleting the stored data, after that, new data can be stored by re-applying the nanoindentation action thereon. The film may be a single crystal metal thin film. The heights, and/or the numbers and the patterns of the hillocks may correspond to the intensity of the nanoindentation action.

Figure 3:
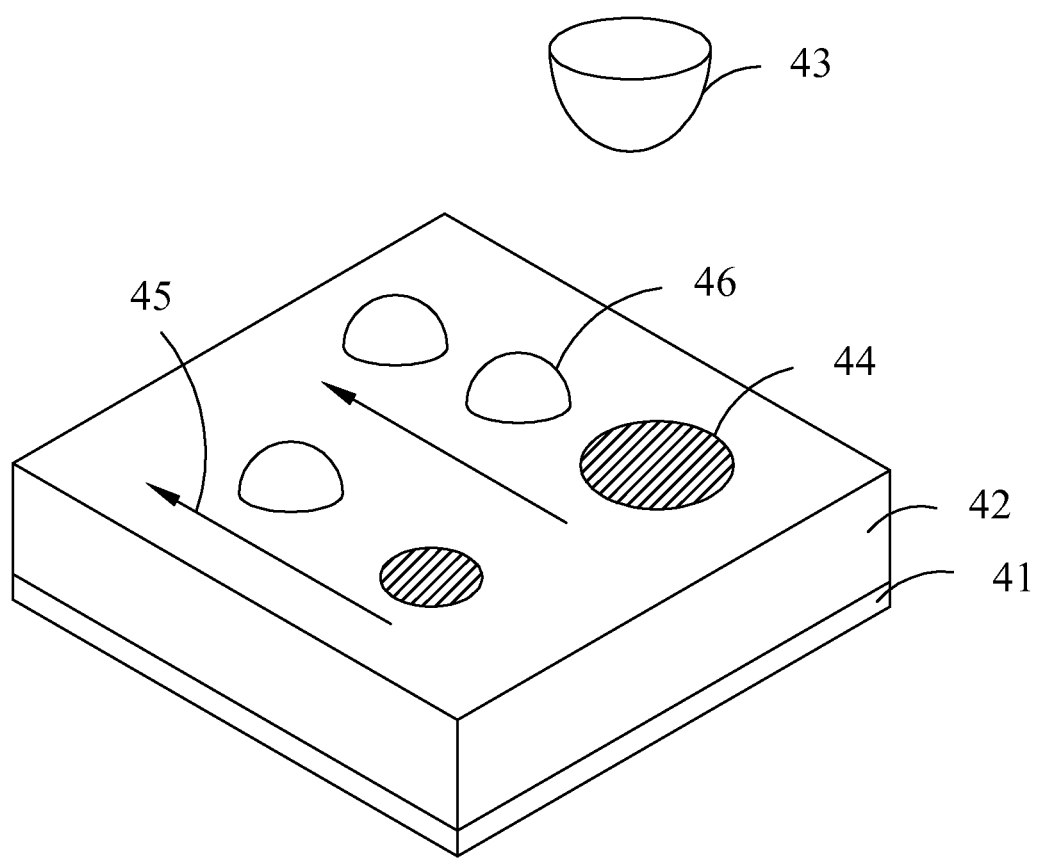
FIG. 3 is a schematic view of a data storage device in accordance with an example of the present invention.

Please refer to FIG. 3 for a schematic view of a data storage device in accordance with an example of the present invention. The data storage device comprises a substrate 41, a thin film 42 capable of controlling lattice directions. The thin film 42 may be formed on the substrate 41, and an indentation 44 may be generated on the thin film 42 by an external nanoindentation action 43. Consequently, at least one hillock 46 for storing data may be generated in a specific direction of the thin film 42 capable of controlling the lattice directions.

The substrate 41 may be composed of metal materials or nonmetal materials. The thin film 42 may be a single crystal metal thin film, and the heights, and/or the numbers and the patterns of the hillocks 46 may correspond to the intensity of the nanoindentation action 43. In addition, the metal thin film 42 may vanish the hillocks for deleting the stored data by means of heating or other removing steps.

To sum up, an indentation may be generated in a specific direction on a thin film capable of controlling lattice directions by providing a nanoindentation action thereon with, for example, a nanoindentation machine. Then, corresponding hillocks are generated upon materials surfaces to form a pattern. The heights, the numbers and the patterns of the hillocks all correspond to the intensity of the nanoindentations action. Moreover, the pattern is preferably a straight line. The higher the intensity is, the longer the pattern may be. Therefore, the intensity of the nanoindentation action may be adjusted with the corresponding data contents, and then the corresponding numbers or heights of the hillocks may be generated for storing data in the binary form, or using more digits for storing data.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for generating nano patterns upon material surfaces, applied for storing data, comprising steps of:
    providing a thin film capable of controlling lattice directions;
    applying a nanoindentation action to the thin film according to the data; and
    generating an indentation at a first specific position of the thin film and thereby generating at least one reversible hillock at a second specific position in a specific direction on the thin film, wherein a top surface of the hillock is higher than a surface of the first specific position of the thin film before applying the indentation, wherein the reversible hillock is produced upward at the second specific position in the specific direction on the thin film.

2. The method according to claim 1, wherein the thin film is a single crystal metal thin film.

3. The method according to claim 1, wherein heights of the hillock correspond to an intensity of the nanoindentation action.

4. The method according to claim 1, wherein numbers and patterns of the hillocks correspond to an intensity of the nanoindentation action.

5. The method according to claim 1, wherein the method further comprises only a heating step to vanish the hillocks such that the thin film is configured for being applied with another nanoindentation action.

* * * * *